(12) United States Patent
Chen

(10) Patent No.: US 10,056,371 B2
(45) Date of Patent: Aug. 21, 2018

(54) MEMORY STRUCTURE HAVING ARRAY-UNDER-PERIPHERY STRUCTURE

(71) Applicant: MACRONIX INTERNATIONAL CO., LTD., Hsinchu (TW)

(72) Inventor: Shih-Hung Chen, Hsinchu County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/213,522

(22) Filed: Jul. 19, 2016

(65) Prior Publication Data

US 2016/0329335 A1    Nov. 10, 2016

Related U.S. Application Data

(63) Continuation-in-part of application No. 13/965,269, filed on Aug. 13, 2013, now Pat. No. 9,425,191.

(51) Int. Cl.

| | |
|---|---|
| *H01L 27/06* | (2006.01) |
| *H01L 27/115* | (2017.01) |
| *H01L 27/11531* | (2017.01) |
| *H01L 27/11573* | (2017.01) |
| *H01L 27/12* | (2006.01) |
| *H01L 27/11551* | (2017.01) |
| *H01L 27/11578* | (2017.01) |

(52) U.S. Cl.
CPC .... *H01L 27/0688* (2013.01); *H01L 27/11531* (2013.01); *H01L 27/11573* (2013.01); *H01L 27/11551* (2013.01); *H01L 27/11578* (2013.01); *H01L 27/1203* (2013.01)

(58) Field of Classification Search
None
See application file for complete search history.

(56) References Cited

U.S. PATENT DOCUMENTS

| | | | | |
|---|---|---|---|---|
| 6,005,270 A | * | 12/1999 | Noguchi | H01L 27/11526 257/20 |
| 9,082,468 B2 | | 7/2015 | Lee et al. | |
| 9,425,191 B2 | * | 8/2016 | Hsiao | H01L 27/0688 |
| 2008/0315373 A1 | * | 12/2008 | Yang | G03F 9/708 257/659 |
| 2009/0294833 A1 | | 12/2009 | Kim | |
| 2011/0204309 A1 | | 8/2011 | Nitta | |
| 2012/0112257 A1 | * | 5/2012 | Kato | H01L 27/0688 257/296 |

(Continued)

FOREIGN PATENT DOCUMENTS

| | | |
|---|---|---|
| TW | 201324532 A1 | 6/2013 |
| TW | 201428899 A | 7/2014 |

OTHER PUBLICATIONS

TW Office Action dated Jun. 25, 2015 in corresponding Taiwan application (No. 102126953).

(Continued)

*Primary Examiner* — Daniel Whalen
(74) *Attorney, Agent, or Firm* — McClure, Qualey & Rodack, LLP

(57) ABSTRACT

A memory structure is provided. The memory structure includes a substrate, an array portion disposed on the substrate, a periphery portion disposed on the array portion, and a plurality of contacts connecting the array portion to the periphery portion.

11 Claims, 3 Drawing Sheets

(56) References Cited

U.S. PATENT DOCUMENTS

| | | | |
|---|---|---|---|
| 2012/0181602 A1* | 7/2012 | Fukuzumi | H01L 27/0688 257/326 |
| 2013/0330907 A1* | 12/2013 | Lutz | H01L 21/76283 438/424 |
| 2014/0061750 A1* | 3/2014 | Kwon | H01L 27/1052 257/314 |
| 2014/0146612 A1 | 5/2014 | Helm et al. | |
| 2014/0151774 A1 | 6/2014 | Rhie | |
| 2015/0206977 A1* | 7/2015 | Katoh | H01L 29/7869 257/43 |

OTHER PUBLICATIONS

TIPO Office Action dated Feb. 12, 2018 in Taiwan application (No. 105123806).

* cited by examiner

MEMORY STRUCTURE HAVING ARRAY-UNDER-PERIPHERY STRUCTURE

This is a continuation-in-part application of application Ser. No. 13/965,269, filed on Aug. 13, 2013, now U.S. Pat. No. 9,425,191, the contents of which are incorporated herein by reference.

TECHNICAL FIELD

The disclosure relates in general to a memory structure, and more particularly to a memory structure having an array-under-periphery structure.

BACKGROUND

Memory devices are used in storage elements for many products such as MP3 players, digital cameras, computer files, etc. As the application increases, the demand for the memory device focuses on small size and large memory capacity. For satisfying the requirement, a memory having a high element density is needed and a 3D stacked memory structure is developed.

In 3D memory, vertically stacking the periphery and memory elements can help to reduce the chip area and the overall cost. Generally, high thermal can help to improve the device performance/reliability of the array device. However, only periphery first process is used traditionally, such that no high thermal process is allowed during the manufacturing processes of the array device to avoid damage on periphery elements.

SUMMARY

The disclosure is directed to a memory structure having an array-under-periphery structure. High thermal process is allowed during the manufacturing processes of the memory structure to optimize the array device, which helps to improve the device performance/reliability of the array device.

According to one embodiment, a memory structure is provided. The memory structure includes a substrate, an array portion disposed on the substrate, a periphery portion disposed on the array portion, and a plurality of contacts connecting the array portion to the periphery portion.

Figure 1:
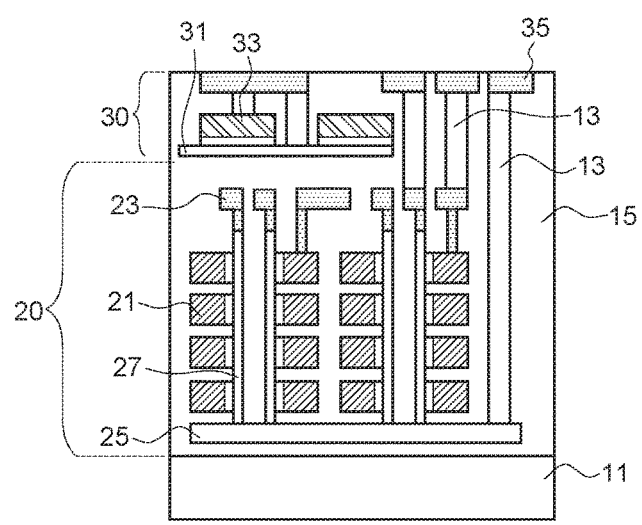
FIG. 1 shows a memory structure in one embodiment according to the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

A number of embodiments of the present disclosure are disclosed below with reference to accompanying drawings. However, the structure and content disclosed in the embodiments are for exemplary and explanatory purposes only, and the scope of protection of the present disclosure is not limited to the embodiments. Designations common to the accompanying drawings and embodiments are used to indicate identical or similar elements. It should be noted that the present disclosure does not illustrate all possible embodiments, and anyone skilled in the technology field of the disclosure will be able to make suitable modifications or changes based on the specification disclosed below to meet actual needs without breaching the spirit of the disclosure. The present disclosure is applicable to other implementations not disclosed in the specification. In addition, the drawings are simplified such that the content of the embodiments can be clearly described, and the shapes, sizes and scales of elements are schematically shown in the drawings for explanatory and exemplary purposes only, not for limiting the scope of protection of the present disclosure.

FIG. 1 shows a memory structure 100 in one embodiment according to the disclosure. As shown in FIG. 1, the memory structure 100 includes a substrate 11, an array portion 20, a periphery portion 30, and a plurality of contacts 13. In the embodiment of the disclosure, the array portion 20 is disposed on the substrate 11, the periphery portion 30 is disposed on the array portion 20, and the contacts 13 connect the array portion 20 to the periphery portion 30.

In one embodiment, the substrate 11 may be a silicon substrate. The array portion 20 may include a plurality of memory elements 21 and a plurality of connection layers 23. The connection layers 23 are disposed under the periphery portion 30 and connect to the memory elements 21. As shown in FIG. 1, portions of the connection layers 23 may connect to the memory elements 21 and the contacts 13.

In one embodiment, the connection layers 23 may be formed of heavy doped polysilicon, and a concentration of the heavy doped polysilicon may be larger than $1 \times 10^{21}/cm^3$. However, the disclosure is not limited thereto. In another embodiment, the connection layers 23 may be a metal layer, and the metal layer may include, for example, tungsten (W) or aluminum (Al).

As show in FIG. 1, the array portion 20 may also include a bottom layer 25 and channel layers 27. In this embodiment, the bottom layer 25 is disposed on the substrate 11. For example, the bottom layer 25 may be used as a ground layer, and the channel layers 27 are vertical channels (VC) connected to the memory elements 21 and the bottom layer 25. That is, the array portion 20 may form a vertical channel (VC) NAND structure. However, the disclosure is not limited thereto.

In one embodiment, the bottom layer 25 may include heavy doped polysilicon. Here, a concentration of the heavy doped polysilicon may be larger than $1 \times 10^{21}/cm^3$. Besides, a thickness of the bottom layer 25 may be larger than 2000 Å for better performance.

As shown in FIG. 1, the periphery portion 30 may include a channel layer 31 and at least one thin-film transistor (TFT) 33. Here, the thin-film transistor 33 may be disposed on the channel layer 31. In one embodiment, the channel layer 31 may include polysilicon. However, the disclosure is not limited thereto. In another embodiment, the channel layer 31 may include indium gallium zinc oxide (IGZO). Further, a thickness of the channel layer 31 may be less than 200 Å.

It should be noted that the thin-film transistor 33 doesn't need to cover the full periphery functions. Once the periphery portion 30 may support local word line driver (LWD) and/or page buffer, it will be very helpful.

As shown in FIG. 1, the periphery portion 30 may also include metal layers 35. In this embodiment, the metal layers 35 may be connected to the thin-film transistor 33 in the periphery portion 30, or to the connection layers 23 and the bottom layer 25 in the array portion 20 through the contacts 13. Further, oxide 15 may be formed on the substrate 11, such that spaces between the elements in the array portion 20 or in the periphery portion 30 may be filled with the oxide 15.

Figure 2:
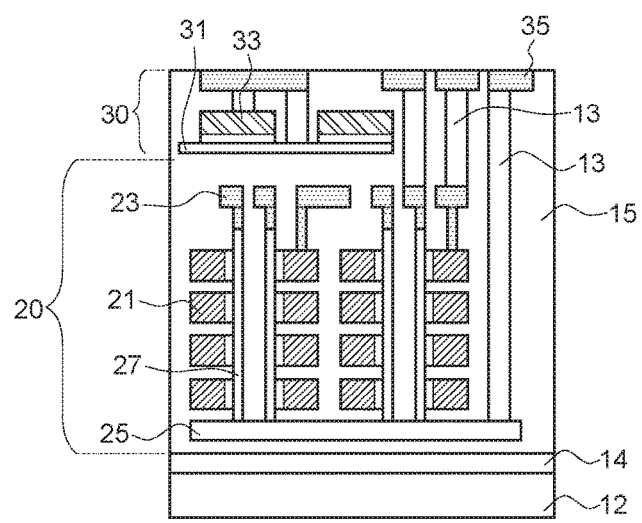
FIG. 2 shows a memory structure in another embodiment according to the disclosure.

FIG. 2 shows a memory structure 101 in another embodiment according to the disclosure. The difference between the memory structure 101 shown in FIG. 2 and the memory structure 100 shown in FIG. 1 is that the substrate 12 of the memory structure 101 shown in FIG. 2 is a glass substrate. Other elements of the memory structure 101 similar to the elements of memory structure 100 will not be described again herein.

In this embodiment, the memory structure 101 may further include an optional layer 14 disposed on the (glass) substrate 12 to make at least one alignment mark for solving the problem of alignment on the (glass) substrate 12. For example, the optional layer 14 may be a silicon layer or a nitride layer.

Figure 3A:
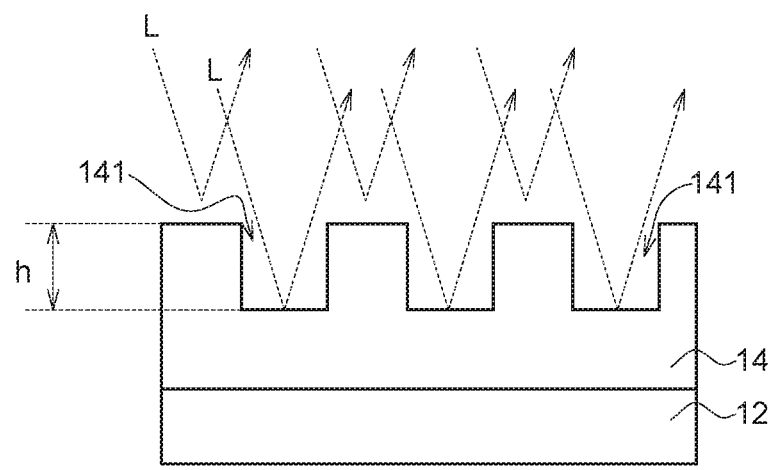
FIG. 3A shows a schematic diagram of the alignment mark in one embodiment according to the disclosure.

FIG. 3A shows a schematic diagram of the alignment mark in one embodiment according to the disclosure. As shown in FIG. 3A, a plurality of cavities 141 may be formed on the optional layer 14 to make the at least one alignment mark. In this embodiment, the optional layer 14 may be formed on the (glass) substrate 12 first, and then the plurality of cavities 141 are formed on the optional layer 14 to make the at least one alignment mark. However, the disclosure is not limited thereto.

Figure 3B:
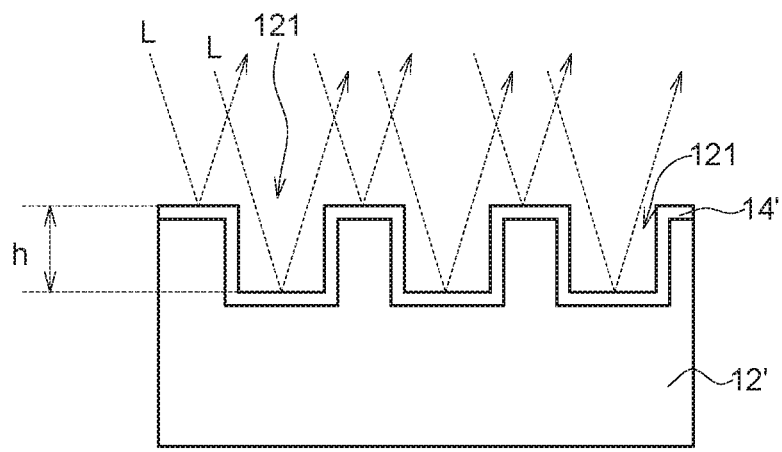
FIG. 3B shows a schematic diagram of the alignment mark in another embodiment according to the disclosure.

FIG. 3B shows a schematic diagram of the alignment mark in another embodiment according to the disclosure. In this embodiment, a plurality of cavities 121 may be formed on the (glass) substrate 12 first, and then the optional layer 14' may be formed on the (glass) substrate 12' to make the at least one alignment mark.

In one embodiment, the size of the alignment mark may be much larger than the wavelength λ of the alignment light source (light L, such as red light). For example, the alignment mark may have an 8 μm pitch, while the alignment light source may have wavelength λ of 6520 Å. In order to optimize the alignment signal, the alignment mark preferably causes the optical path difference of ½ wavelength λ, such that the destructive interference may be maximized to enhance contrast. In this case, twice depth 2h of the cavities 141 in FIG. 3A (or the cavities 121 in FIG. 3B) may be $$\frac{1}{2}\lambda.$$

That is, the depth h of the cavities 141 in FIG. 3A (or the cavities 121 in FIG. 3B) may be $$\frac{1}{4}\lambda.$$

Assumed that a refractive index n of the stacked layer on the optional layer 14 (e.g. the bottom layer 25 including polysilicon) is 1.5, and the alignment light source is red light having wavelength λ of 6520 Å, the depth h of the cavities 141 in FIG. 3A (or the cavities 121 in FIG. 3B) may between 800 Å and 1400 Å, such as 1100 Å.

Although FIG. 2-3B show that a plurality of cavities 141 may be formed on the optional layer 14 or a plurality of cavities 21 may be formed on (glass) substrate 12' to make at least one alignment mark, the disclosure is not limited thereto.

Figure 3C:
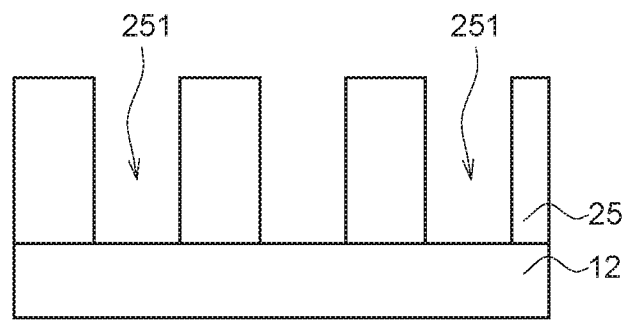
FIG. 3C shows a schematic diagram of the alignment mark in still another embodiment according to the disclosure.

FIG. 3C shows a schematic diagram of the alignment mark in still another embodiment according to the disclosure. In this embodiment, the optional layer 14 may be omitted, the bottom layer 25 may be disposed directly on the (glass) substrate 12, and the at least one alignment mark may be formed on the bottom layer 25. As shown in FIG. 3C, a plurality of cavities 251 may be formed on the bottom layer 25 to make the at least one alignment mark. In one embodiment, the plurality of cavities 251 may completely penetrate the bottom layer 25 and expose portions of the top surface of the (glass) substrate 12. That is, the alignment mark and other patterns on the bottom layer 25 may be formed at the same etching process to save the manufacturing costs.

Although the alignment mark is formed on the bottom layer 25 in the embodiment shown in FIG. 3C, the disclosure is not limited thereto. In some embodiments, the alignment mark may be formed on other stacked layers under the memory elements 21 in the array portion 20.

Figure 4:
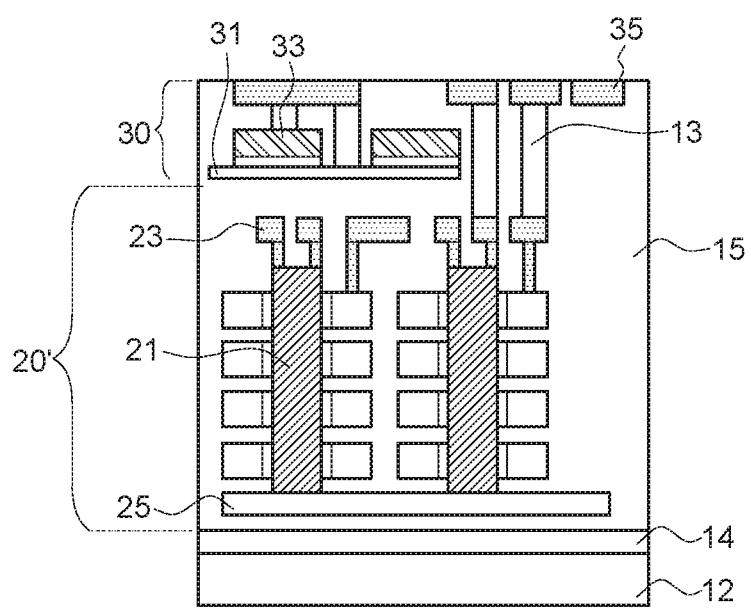
FIG. 4 shows a memory structure in still another embodiment according to the disclosure.

FIG. 1 (and FIG. 2) takes a vertical channel (VC) NAND structure in the array portion 20 as an example. However, the disclosure is not limited thereto. FIG. 4 shows a memory structure 102 in still another embodiment according to the disclosure. As shown in FIG. 4, a vertical gate (VG) NAND structure is formed in the array portion 20. That is, the memory elements in the array portion 20 may include vertical gates.

It should be noted that other types of array structure may also be formed in the array portion of the memory structure according to the disclosure. The embodiments described above are for exemplary and explanatory purposes only, and the scope of protection of the present disclosure is not limited to the embodiments.

According to the embodiments above, since the memory structure in the disclosure has an array-under-periphery structure, high thermal process is allowed during the manufacturing processes of the memory structure to optimize the array device, which helps to improve the device performance/reliability of the array device.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:
1. A memory structure, comprising:
a substrate;
an insulating layer disposed on the substrate, the insulating layer being a silicon oxide layer or a nitride layer; and
a plurality of cavities formed on the insulating layer to make at least one alignment mark;
an array portion disposed above the insulating layer and the plurality of cavities;
a periphery portion disposed above the array portion; and a plurality of contacts connecting the array portion to the periphery portion.

2. The memory structure according to claim 1, wherein a depth of the plurality of cavities is between 800 Å and 1400 Å.

3. The memory structure according to claim 1, wherein the substrate is a silicon substrate.

4. The memory structure according to claim 1, wherein the array portion comprise:
   a plurality of memory elements; and
   a plurality of connection layers disposed under the periphery portion and connecting to the plurality of memory elements.

5. The memory structure according to claim 4, wherein portions of the plurality of connection layers connect to the plurality of contacts.

6. The memory structure according to claim 4, wherein the plurality of connection layers is formed of heavy doped polysilicon having a concentration larger than $1\times10^{21}/cm^3$.

7. The memory structure according to claim 4, wherein the plurality of connection layers is a metal layer, and the metal layer comprises tungsten.

8. The memory structure according to claim 4, wherein the plurality of memory elements comprises vertical channels.

9. The memory structure according to claim 4, wherein the plurality of memory elements comprises vertical gates.

10. The memory structure according to claim 1, wherein the periphery portion comprises at least one thin-film transistor and a channel layer, the channel layer comprises indium gallium zinc oxide or polysilicon, and a thickness of the channel layer is less than 200 Å.

11. The memory structure according to claim 1, wherein the substrate is a glass substrate.

* * * * *